(12) United States Patent
Papagianni et al.

(10) Patent No.: US 11,609,712 B2
(45) Date of Patent: *Mar. 21, 2023

(54) WRITE OPERATIONS TO MITIGATE WRITE DISTURB

(71) Applicant: Micron Technology, Inc., Boise, ID (US)

(72) Inventors: Christina Papagianni, San Jose, CA (US); Foroozan Koushan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 1 day.

This patent is subject to a terminal disclaimer.

(21) Appl. No.: 17/320,658

(22) Filed: May 14, 2021

(65) Prior Publication Data

US 2021/0272636 A1  Sep. 2, 2021

Related U.S. Application Data

(63) Continuation of application No. 16/715,565, filed on Dec. 16, 2019, now Pat. No. 11,037,638.

(51) Int. Cl.
*G06F 3/00* (2006.01)
*G06F 3/06* (2006.01)
*G11C 16/34* (2006.01)

(52) U.S. Cl.
CPC ............ *G06F 3/0659* (2013.01); *G06F 3/068* (2013.01); *G06F 3/0619* (2013.01); *G06F 3/0653* (2013.01); *G11C 16/3418* (2013.01)

(58) Field of Classification Search
CPC .... G06F 3/0659; G06F 3/0604; G06F 3/0619; G06F 3/0653; G06F 12/0246; G06F 3/061; G06F 3/064; G06F 3/0656; G06F 3/067; G06F 3/0679; G06F 3/068; G06F 11/1451; G06F 11/1461; G06F 11/1464; G06F 11/1469; G06F 11/2056; G06F 11/2071; G06F 11/2092; G06F 2212/7202; G06F 3/0629; G06F 3/0644; G06F 3/065; G06F 11/10; G06F 11/1008; G06F 11/1072; G06F 11/1076; G06F 12/1009; G06F 16/245; G06F 2211/1061; G06F 2212/1044; G06F 2212/7201; G06F 2212/7203;

(Continued)

(56) References Cited

U.S. PATENT DOCUMENTS 11,037,638 B1 * 6/2021 Papagianni ........... G06F 3/0653
2019/0267100 A1 * 8/2019 Pan ........................ G11C 16/26
2019/0377632 A1  12/2019 Oh et al.

OTHER PUBLICATIONS

USPTO, Office Action for U.S. Appl. No. 16/715,565, dated Nov. 19, 2020.

(Continued)

*Primary Examiner* — Thong Q Le
(74) *Attorney, Agent, or Firm* — Lowenstein Sandler LLP

(57) ABSTRACT

A first write operation is performed to write a first portion of a set of host data to a first location of a memory device. It is determined whether a first elapsed time since the first operation is performed does not satisfy a time condition. Responsive to determining that the first elapsed time does not satisfy the time condition, a second write operation is performed to write a second portion of the set of host data to a second location of the memory device not adjacent to the first location.

20 Claims, 6 Drawing Sheets

(58) Field of Classification Search
CPC ..... G06F 2212/7208; G06F 2212/7209; G06F 3/0673; G06F 3/0688; G06F 9/50; G06F 9/5016; G06F 9/524; G06F 9/526; G11C 16/10; G11C 11/5628; G11C 16/0483; G11C 16/3418; G11C 16/3427; G11C 16/08; G11C 16/24; G11C 16/26; G11C 16/32; G11C 16/3431
See application file for complete search history.

(56) References Cited

OTHER PUBLICATIONS

USPTO, Notice of Allowance for U.S. Appl. No. 16/715,565 dated Feb. 18, 2021.

* cited by examiner

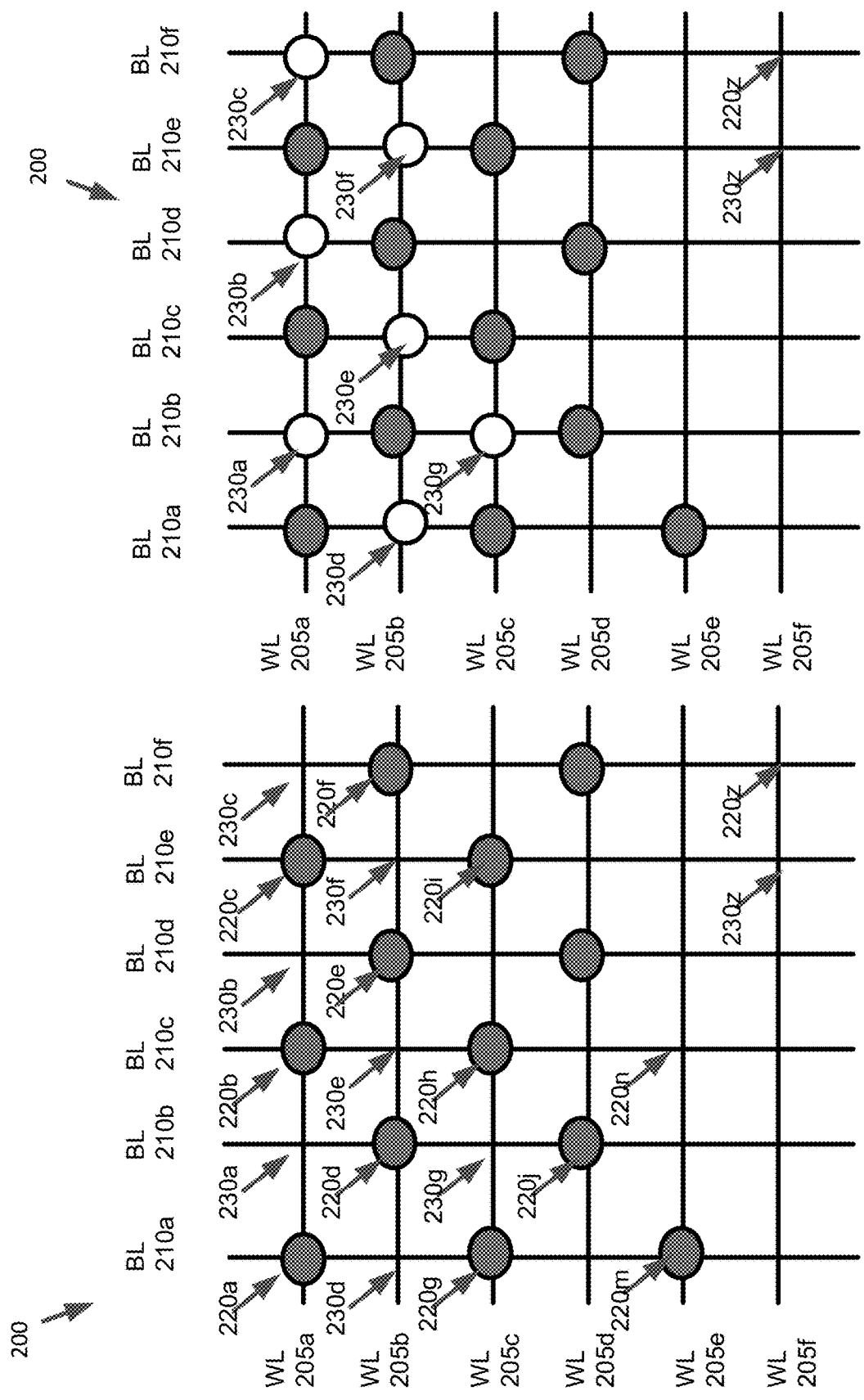

WRITE OPERATIONS TO MITIGATE WRITE DISTURB

RELATED APPLICATION

The present Application is a Continuation of U.S. patent application Ser. No. 16/715,565, filed on Dec. 16, 2019, entitled "WRITE OPERATIONS TO MITIGATE WRITE DISTURB", which is incorporated herein by reference in its entirety for all purposes.

TECHNICAL FIELD

Embodiments of the disclosure relate generally to memory sub-systems, and more specifically, relate to performing write operations to mitigate write disturb in memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 2A-2B depict an example of performing write operations in adjacent cells with a delay in response to a host request, in accordance with some embodiments of the present disclosure.

DETAILED DESCRIPTION

Figure 1:
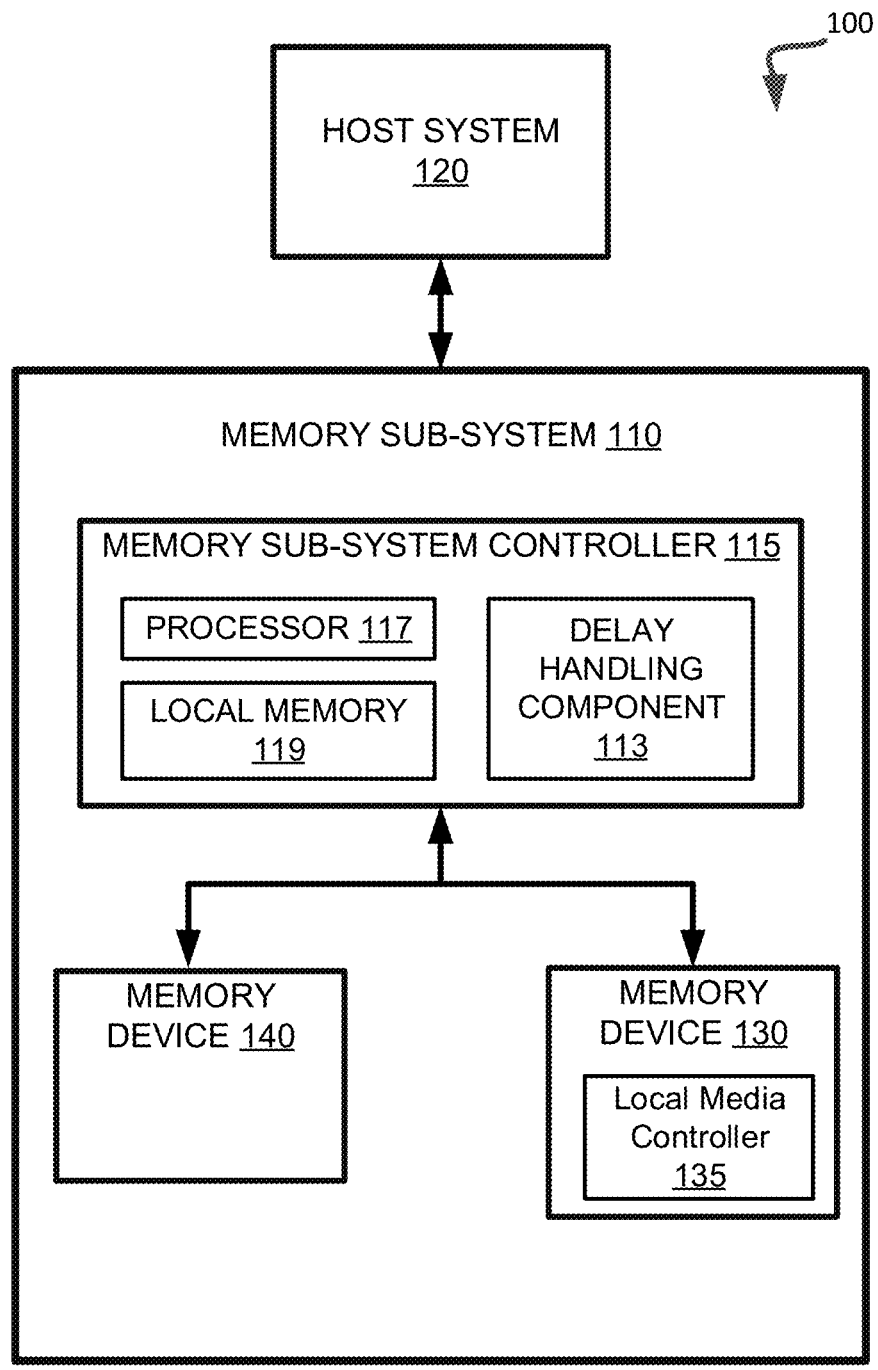
FIG. 1 illustrates an example computing system that includes a memory sub-system in accordance with some embodiments of the present disclosure.

Aspects of the present disclosure are directed to performing write operations to mitigate write disturb in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The memory device can be a non-volatile memory device, which is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory cells that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. Depending on the cell type, a cell can store one or more bits of binary information, and has various logic states that correlate to the number of bits being stored. The logic states can be represented by binary values, such as "0" and "1, or combinations of such values. For example, a single level cell "(SLC) can store one bit of information and has two logic states.

When data is conventionally written to a memory cell of the memory device for storage, adjacent (e.g., contiguous, neighboring, nearby, next to, etc.) memory cells can experience what is known as "write disturb." Write disturb is the result of continually writing data to a particular memory cell without writing and/or refreshing data stored at nearby memory cells, causing the nearby memory cells to change state over time (e.g., the programmed state changes). If too many write operations are performed on the particular memory cell (also referred to as the "aggressor cell" hereinafter), data stored at adjacent or proximate memory cells (also referred to as the "victim cell" or "target cell" hereinafter) of the memory device can become corrupted or incorrectly stored. The heat generated from the aggressor cell during the write operations can cause the memory alloy of the victim cell to crystalize, degrading its quality. Thus, in traditional memory sub-systems, a higher error rate can result when reading the data stored at the adjacent or proximate memory cells. The higher error rate (e.g., raw bit error rate, or RBER) can increase the use of an error detection and correction operation (e.g., an error control operation) for subsequent operations (e.g., read and/or write) performed on the memory cell. The increased use of the error control operation can result in a reduction of the performance of the conventional memory sub-system. As more resources of the memory sub-system are used to perform the error control operation, fewer resources can be used to perform other read operations or write operations. Thus, the performance of the memory sub-system can be decreased as fewer read operations and write operations can be performed within a particular amount of time.

To mitigate the effects of write disturb on data stored at the memory sub-system, conventional memory sub-systems typically utilize various write refresh processes. For example, conventional memory sub-systems can perform a write refresh based on a number of write operations performed on a managed unit. A managed unit can be defined as a unit of user data that is managed and/or operated on by the memory device. A managed unit can be defined by a size (e.g., bytes) of data. Typically, the memory sub-system stores the number of write operations performed on managed units of the memory device as metadata on the memory device. The number of write operations performed on a managed unit can be read from the metadata stored at the memory device and used to determine a disturb count for one or more of the portions (e.g., proximate memory cells) of the memory device. The disturb count can correspond to a number of write operations performed on a particular managed unit without an intervening write or refresh operation for the particular managed unit. Once the disturb count exceeds a threshold number of write operations, the data of the managed unit of the memory device can be refreshed (i.e., copied and written to another managed unit of the same or a different memory device). Furthermore, some conventional memory sub-systems can utilize a single count of write operations performed on the memory device rather than a separate count for each managed unit. Once the number of write operations satisfies a threshold condition (e.g., meets or exceeds a threshold value), a memory cell of the memory device is identified for the refresh operation.

In some examples, refreshing the data stored at one or more memory cells can include reading the data from the one or more memory cells, then writing the data back to the one or more memory cells. As the data is more recently written back on the memory cell, the effect of write disturb (e.g., read error resulting from state change of the cell due to write disturb) can be mitigated as further time passes. In some examples, refreshing the data can include clearing out the existing logical to physical address data mapping and setting the logical to physical address mapping anew. Since the operations involved in the write refresh process are performed in addition to the actual host data operations (e.g., read, write, etc.), the process of write refresh can reduce device lifetime and increase read time. Additionally, in a cross-point array type memory, the managed units of the memory device can be relatively small and the number of write counts can be in the millions due to high endurance of the cross-point array type memory. The storing of the disturb count can result in a large amount of overhead of the memory sub-system being dedicated towards storing the number of write operations performed on managed units of the memory device. Furthermore, in a conventional memory sub-system, each time a write operation is performed on a particular managed unit, the metadata associated with the number of write operations for the particular managed unit is read from the memory device, incremented to reflect the recently performed write operation, and then the updated metadata is written back to the memory device. The process of maintaining the write count metadata is performed for each managed unit of the memory device. The performance of these operations each time a write operation is performed consumes a large amount of resources of the memory sub-system. Furthermore, a memory device can include hundreds of thousands of managed units. Maintaining the write count metadata for such a large number of managed units consumes a large amount of computing resources of the memory sub-system. This results in a decrease in the performance of the memory sub-system as well as less capacity of the memory sub-system being used to store user data.

Aspects of the present disclosure address the above and other deficiencies by performing write operations to store data in particular cells to create a minimum amount of delay (e.g., lag time, wait time, etc.), without causing a delay between two consecutive write operations to write host data, to mitigate or avoid write disturb. The minimum delay can correspond to a threshold time based on various factors, such as, experimentation, system specification, etc. The minimum delay between the write operations in adjacent cells can allow the adjacent cells to dissipate heat and reduce the temperature. As a result, the memory cells can recover before the next write operation takes place and can be prevented from being crystalized. As the delay between write operations in adjacent cells increase, the RBER continues to decrease, to the point that the error rate can be completely diminished. The present disclosure provides for implementing a delay in write operations of adjacent cells by utilizing various patterns of write operations that cause the host data to be written to memory cells that are not adjacent to each other for consecutive write operations until a sufficient delay has occurred. For example, a first pattern can be used which can include performing write operations to write a set of host data to multiple cells, where a portion of the data is written to a first cell for a first write operation, then the next cell in the array is skipped, and the next portion of the data is written to a second cell not adjacent to the first cell for a consecutive, next write operation. The first pattern can continue until a time condition is satisfied. For example, the time condition can be satisfied when an elapsed time since the first write operation is above a threshold time. Once the time condition is satisfied, then a second pattern can be used, where the next, consecutive write operation is performed to write the next portion of the host data to a cell that is adjacent to the first cell, and continue to write the remaining portions of the host data to the cells that were skipped using the first pattern. Using the alternating patterns, the total time to write the host data can remain unchanged while a minimum delay between write operations of adjacent cells is introduced by design. Various other patterns can be used to achieve a sufficient delay between two adjacent cells that minimize the effect of write disturb, as described throughout the disclosure.

Advantages of the present disclosure include, but are not limited to, an increased reliability of data stored at the memory sub-system. Since the effects of write disturb stress on the data stored in the nearby cells is mitigated, the number of errors found in data stored at the memory sub-system is reduced. The reduced error rate associated with the data stored at the nearby memory cells can decrease the number of error correction operations that are performed by the memory sub-system and improve the performance of the memory sub-system. Additionally, the delay between writing to adjacent cells is implemented without any increase in total time performing the write operation requested by the host system. Furthermore, by introducing an inherent delay instead of performing a write refresh to compensate for the effects of write disturb, the amount of computing resources being dedicated to performing clearing and rewriting data for the write refresh is decreased. Since less computing resources are being dedicated to performing error correction and write refresh operations, the computing resources can be used to perform other operations (e.g., reading and writing data) for a host system and the capacity of the memory sub-system to store data from the host system is increased. This results in an improvement in the performance of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transitorrandom-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a delay handling component 113 that can cause a delay between write operations of adjacent memory cells. In some embodiments, the memory sub-system controller 115 includes at least a portion of the delay handling component 113. For example, the memory sub-system controller 115 can include a processor 117 (processing device) configured to execute instructions stored in local memory 119 for performing the operations described herein. In some embodiments, the delay handling component 113 is part of the host system 110, an application, or an operating system.

The delay handling component 113 can be used to perform write operations in adjacent cells with a delay. The write operations can be performed such that data is written to adjacent memory cells with at least a minimum delay. In an example, controller 115 can perform a first write operation to write a first portion of a set of host data on a first cell of a data block. The delay handling component 113 can monitor an elapsed time since the first write operation is performed to determine whether the elapsed time satisfies a time condition. For example, a time condition can be satisfied if the elapsed time is greater than a threshold time. If it is determined that the time condition is not satisfied (e.g., the elapsed time is less than or equal to the threshold time), then the controller can perform a second write operation to write a second portion of the set of host data on a second cell of the data block that is not adjacent to the first cell. The delay handling component 113 can continue to monitor the elapsed time since the first write operation, and until the time condition is satisfied, controller 115 can continue to write to a cell that is not adjacent to the first cell. When it is determined that the time condition is satisfied (e.g. the elapsed time is greater than the threshold time), the controller 115 can write the date to a cell that is adjacent to the first cell. Accordingly, delay handling component 113 causes the write operations between adjacent first and second cells to have a delay. Further details with regards to the operations of the delay handling component 113 are described below.

FIGS. 2A-2B depict an example of performing write operations in adjacent cells of a memory device 200 with a delay in response to a host request, in accordance with some embodiments of the present disclosure. Memory device 200 includes word lines 205a-f and bit lines 210a-f. Memory cells, such as memory cells at location 220a-220z, and 230a-230z, are located at the intersection of each of word lines 205a-f and bit lines 210a-f.

When a write operation is performed on a particular memory cell (e.g., an aggressor cell), write disturb stress can affect data stored at memory cells that are adjacent (e.g., victim cells) to the memory cell that the write operation was performed on. Adjacent cells can include cells that are proximate, nearby, neighboring, contiguous, etc., to each other. The further away a memory cell is from another memory cell, the lesser is the effect of write disturb stress on each other. In an example, if a write operation is performed on memory cell at location 220d, then write disturb can have the highest effect on data stored at memory cells at locations 230a, 230e, 230g, and 230d which are all adjacent to location 220d. As the distance between the cells increase, the effect of write disturb gets reduced. Thus, write disturb effect from location 220d is minimized at locations that are not adjacent to location 220d, such as, locations 220a, 220b, 230b, 220g, 220h, 220e, 220j, 230b, etc. Additionally, while in some examples, an adjacent cell can include a cell immediately next to the aggressor cell, in other examples, an adjacent cell can include a cell that is not the immediately next to the aggressor cell. Whether a cell is considered an adjacent cell can depend on the specific technological implementation of the memory sub-system and dimension of the array layout. For example, if cells are placed relatively close to each other, then the range of cells that are considered victim cells to the write operation in an aggressor cell can widen and will include more devices. For example, in some configuration of the memory sub-system, cells 220a, 220b, 220g, 220h which are diagonal cells to 220d can be impacted by the write operation in cell 220d due to the placement of the cells being in close proximity to cell 220d. In that case, the diagonal cells can be considered to be adjacent cells to the aggressor cell. Moreover, as time passes after performing a write operation on a particular memory cell, the heat generated from the write operation is dissipated and after a certain amount of time elapses since the write operation is performed, the effect of write disturb is minimized on a cell adjacent to the particular cell. For example, if a write operation is performed on memory cell at location 220*d* at time t1, the effect of write disturb from data written on location 220*d* is minimized on adjacent location 230*a*, 230*e*, 230*g*, and 230*d* after a certain amount of time delay after time t1. A delay can be a lag, gap, or wait time between two operations. The time sufficient to minimize the write disturb effect on an adjacent cell can vary based on specification of the memory sub-system.

In an embodiment of the present disclosure, the memory sub-system can receive a request to write a set of host data and can perform write operations to write the set of host data to memory cells of memory device 200. To mitigate the effects of write disturb caused by a write operation performed on a particular memory cell on its adjacent cells, the memory sub-system performs write operations such that time elapsed between writing to adjacent cells satisfies a threshold time sufficient to overcome the write disturb effect of performing a write operation on the adjacent cells, without increasing the overall time to write data for a host request. For example, if a write operation is performed on memory cell at location 220*d*, the memory sub-system performs the subsequent write operation to a location that is not adjacent to location 220*d*. That is, the memory sub-system skips performing the subsequent write operation at any of the memory cells located at 230*a*, 230*e*, 230*g*, and 230*d* and performs the write operation to another memory cell location besides locations 230*a*, 230*e*, 230*g*, and 230*d*. The memory sub-system then performs a write operation to one of the cells located at 230*a*, 230*e*, 230*g*, and 230*d* after a minimum time delay (e.g., a threshold time defined within the memory sub-system) has passed since the write operation was performed at memory cell location 220*d*. In this manner, no wait time is experiences between consecutive write operations performed by the memory sub-system, while a delay is inherently introduced for write operations between adjacent cells, and overall time to perform the write operations for the host system is not increased compared to performing consecutive write operations in adjacent cells.

In some implementations, the memory sub-system can use a particular pattern of write operations such that data is written to locations where the write disturb effect of performing write operations on particular cells is minimized during the time the write disturb effect still exists. The memory sub-system can use another pattern of write operations to write the remaining data to the remaining cells in the memory device 200 that are adjacent to the particular cells at a time after a sufficient time delay has passed for the write disturb effect to have minimized.

In an embodiment, the memory sub-system can receive a request to write a set of host data and can perform a plurality of write operations to write the set of host data to memory cells of memory device 200. For example, in one implementation, the memory sub-system can use a pattern similar to a checkerboard pattern, where alternating locations are used for writing portions of the host data in consecutive write operations. As shown in FIG. 2A, the memory sub-system performs the plurality of write operations following a first pattern using alternating memory cells. According to the first pattern, the memory sub-system starts the write operations using word line 205*a*, and performs a first write operation of the plurality of write operations to write a first portion of the set of host data to a first memory cell located at a first location 220*a*. (e.g., at word line 205*a* and bit line 210*a*). Then the memory sub-system continues on word line 205*a*, but bypasses the next bit line 210*b* to skip writing on memory cell 230*a*, and performs a second write operation of the plurality of write operations to write a second portion of the set of host data to a second memory cell located at location 220*b*. (e.g., at word line 205*a* and bit line 210*c*). The memory sub-system continues to perform write operations on word line 205*a*, skipping the memory cells (e.g., 230*b*, 230*c*) at every other bit line, until no bit line on word line 205*a* remains to be written to. In this manner, the memory sub-system performs a write operation in one cell and skips performing the subsequent write operation at the adjacent cell that is impacted by write disturb of the preceding write operation on the previous cell. The memory sub-system then continues to write on the next word line 205*b*. The memory sub-system skips writing on memory cell 230*d* on bit line 210*a*, since cell 230*d* is located adjacent to cell 220*a* where write operation has been performed. The memory sub-system performs the subsequent write operation of the plurality of write operations on memory cell 220*d*, and so on, skipping every alternate memory cell (e.g., 230*e*, 230*f*, etc.) on word line 205*b*. The first pattern of the write operations can continue to be used for each word line on memory device 200, avoiding writing in adjacent memory cells for consecutive write operations to finish writing the set of host data, minimizing write disturb.

In one implementation, the memory sub-system can monitor a time that has elapsed ("elapsed time") since the first write operation is performed to write the first portion of the set of host data at memory cell 220*a*. The memory sub-system can determine whether the elapsed time satisfies a time condition. For example, the elapsed time can satisfy the time condition if the elapsed time is greater than a threshold time. The memory sub-system can define a threshold time (e.g., a minimum delay time) based on a specification of the memory sub-system, such that the threshold time is sufficient to minimize the write disturb effect of an aggressor cell on victim cells. If it is determined that the elapsed time does not satisfy the time condition (e.g., the elapsed time is equal to or below the threshold time), then the memory sub-system continues to perform rest of the plurality of write operations using the first pattern, writing portions of the host data in memory cells 220*b*, 220*c*, 220*d*, and so on, as described above with reference to FIG. 2A. The memory sub-system also continues to monitor the elapsed time to determine whether the elapsed time satisfies the time condition after performing each write operation of the plurality of write operations.

In one implementation, if it is determined that the elapsed time satisfies the time condition (e.g., elapsed time is greater than threshold time), the memory sub-system can cease to perform the rest of the write operations using the first pattern. For example, as depicted in FIG. 2A, after writing to memory cell 220*m* of word line 205*e*, the memory sub-system determines that the elapsed time is greater than the threshold time, and stops performing subsequent write operations in word line 205*e* using the first pattern. Instead, upon determining the time condition is satisfied, the memory sub-system can switch to using a second pattern (e.g., an inverse checker board pattern), where the memory sub-system writes the remaining portions of the host data at the locations adjacent to the aggressor cells that were previously skipped. For example, as depicted in FIG. 2B, the memory sub-system performs a write operation to write a portion of the set of host data on memory cell 230*a*, which is adjacent to the first location 220a on which the first write operation was performed. The elapsed time between the write operation on location 220a and the write operation on adjacent cell at location 230a satisfies the time condition, as the elapsed time is greater than the threshold time (e.g., the minimum delay time). As a result, the effect of write disturb from the write operation on the aggressor cell located at 220a is minimized on the adjacent cell located at 230a by the time the data is written on the adjacent cell at 130a. The memory sub-system continues to write the remaining portions of the set of host data in the remaining memory cells 230b, 230c, 230d, and so on (e.g., the cells which were skipped during performing the write operations using the first pattern), until the remaining of the host data is written in memory device 200, finishing the write operations at memory cell 230g.

In one implementation, even if it is determined that the elapsed time satisfies the time condition (e.g., elapsed time is greater than threshold time), the memory sub-system can nevertheless continue to perform the write operations using the first pattern. For example, the memory sub-system can continue to write the data at memory cell 220n, after skipping memory cell at the intersection of bit line 210b on word line 205d. The memory sub-system can continue to write the data until data is written at the last memory cell 220z on the last word line 205f. In some implementation, continuing to write data until the end of the word line can guarantee that the elapsed time is greater than the threshold time due to the specification of the memory sub-system. In such cases, the memory sub-system can perform the write operations using the first pattern until the end of the word line is reached, without monitoring the elapsed time to determine whether the time condition is satisfied, because by default the elapsed time is known to be greater than the threshold time in such memory sub-systems by the time end of the word line is reached. At that time, the memory sub-system can switch to performing the write operations using the second pattern as shown in FIG. 2B, in which case memory sub-system writes data in memory cell 230a adjacent to the first memory cell 220a, and the elapsed time between the write operations in the two adjacent cells are greater than the threshold time by design.

In an implementation, if elapsed time is not satisfied when the word line ends due to the particular specification of the memory sub-system, the memory sub-system does not switch to writing the data using the second pattern as shown in FIG. 2B, as the effect of write disturb is not minimized on the adjacent cells yet. In such cases, the memory sub-system can perform the subsequent write operations on a different data unit, such as on a different block, plane, or memory device. In an implementation, when the memory sub-system performs write operations using the second pattern and the end of the last word line is reached (e.g., all memory cells have been used) before finishing writing the host data fully, the memory sub-system can write the host data to another data unit (e.g., different block, plane, or memory device, etc.) following the patterns described in FIGS. 2A and 2B.

In some implementations, the memory sub-system tracks an individual elapsed time for each of the write operations of the plurality of write operations on aggressor cells and determines whether each of the individual elapsed time satisfies the time condition and then writes data to each of the adjacent cells to the aggressor cells based on the determination that each of the respective individual elapsed time satisfies the time condition.

In some implementations, the patterns used by the memory sub-system are predefined within the memory sub-system. The memory sub-system can identify available locations corresponding to memory cells to which data is to be written following a particular pattern. For example, for the first pattern described in FIG. 2A, the memory sub-system can identify memory cells 220a, 220b, 220c through 220z as available memory cells for use with the first pattern. That is, after the memory sub-system finishes writing data to cell 220a, the next memory cell available for performing the subsequent write operation is identified as 220b, and so on. Similarly, for the second pattern shown in FIG. 2B, the memory sub-system can identify memory cells 230a, 230b, 230c through 230z as available memory cells for use with the second pattern. The order of the memory cells can be identified in the predefined list of memory cells available for use by the memory sub-system. The predefined list can be stored in metadata.

In some implementations, the memory sub-system performs the write operations by tracking the memory cells that have been written to and the memory cells that remain to be written to. For example, the memory sub-system can track that a write operation was performed using memory cell 220a. The memory sub-system can dynamically determine to skip the adjacent memory cell 230a by skipping to write data in the next bit line 210b. The memory sub-system can detect which cells are adjacent to cell 220a and keep track of the adjacent cells. For the subsequent write operation, the memory sub-system skips writing the data in the identified adjacent cells. Skipping decision by the memory sub-system can be made based on a previously defined and loaded information and/or logic in the system (e.g., including, but not be limited to, part of the delay handling component 113). The memory sub-system skips writing to the adjacent cells if the elapsed time between the writes is equal to or below a predefined threshold value. The predefined threshold value can also be stored as part of the delay handling component 113. This information is defined per technology node, and is pre-programmed in the system.

Figures 3A, 3B:
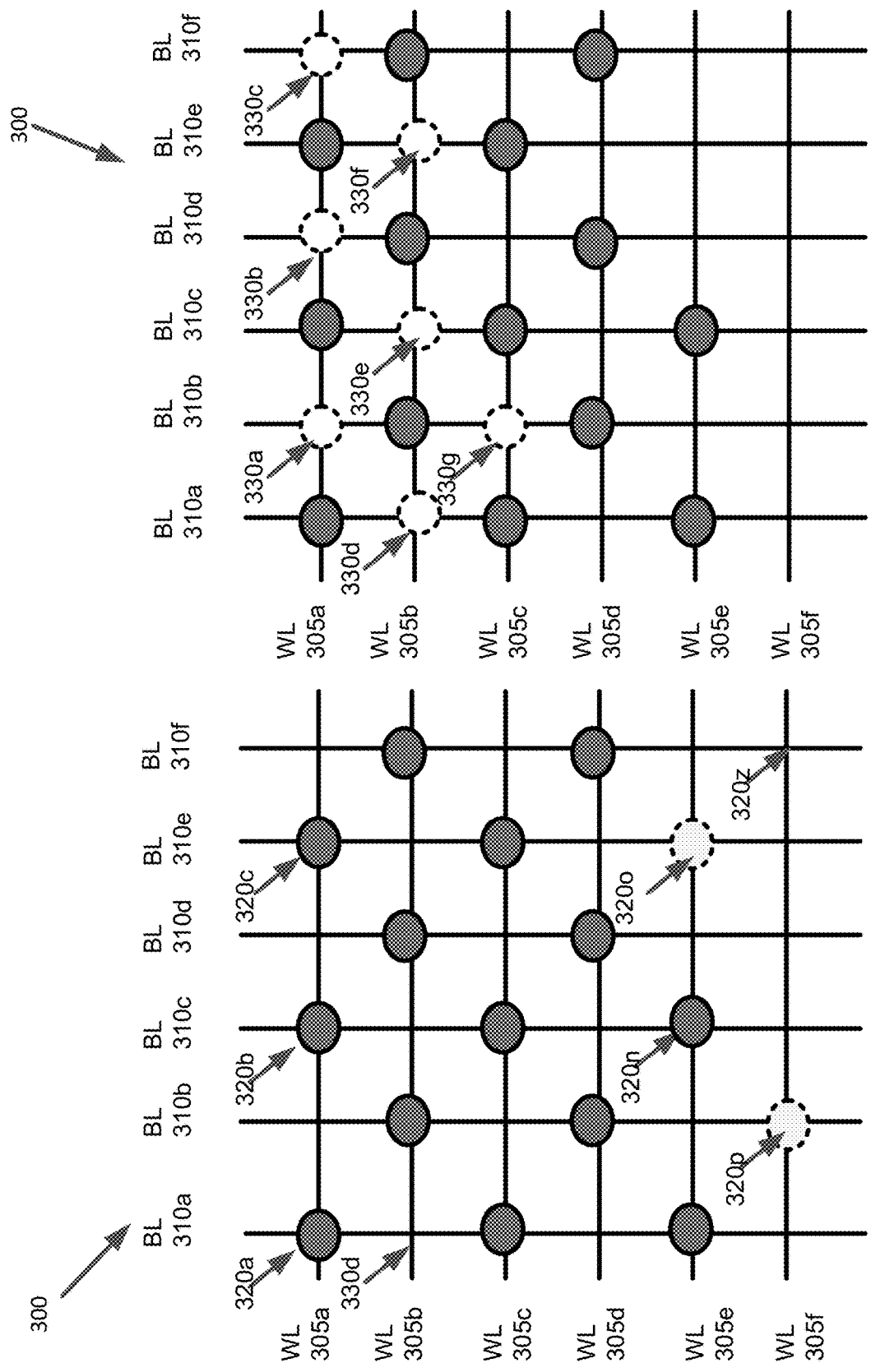
FIGS. 3A-3B depict an example of performing write operations from multiple host requests with a delay, in accordance with some embodiments of the present disclosure.

FIGS. 3A-3B depict an example of performing write operations in memory cells of memory device 300 from multiple host requests, in accordance with some embodiments of the present disclosure. A host system (e.g., host system 120 in FIG. 1) can initiate a data operation (e.g., write, read, erase, etc.) on a memory sub-system (e.g., memory sub-system 110 in FIG. 1). The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data.

In an embodiment, the memory sub-system can receive a first request to write a first set of host data ("first data set") and a second request to write a second set of host data ("second data set"). The memory sub-system can perform write operations to write the first set of host data and the second set of host data on memory device 300, such that the elapsed time between write operations on aggressor cell and victim cell adjacent to the aggressor cell satisfies a time condition (e.g., greater than a threshold time).

In one implementation, it is determined that an elapsed time between performing a first write operation for the first data set and a first write operation for the second data set satisfies the time condition. In one example, the time condition can be satisfied due to the first set of data including a large amount of data that takes longer than the threshold time to write. In another example, the time condition can be satisfied because the second request is received after the threshold time has passed since the first write operation for the first data set. When the elapsed time satisfies the time condition, the memory sub-system can continue to perform the first operation of the second data set using the first pattern as described in FIGS. 2A. Alternatively, the memory sub-system can switch to writing the second set of data using the second pattern as described in FIG. 2B.

In one example, as shown in FIG. 3A, the memory sub-system receives the first data set and performs write operations to write the first data set using the first pattern in memory cells 320a through 320n. After the last portion of the first data set is written to cell 320n, it is determined that the elapsed time had satisfied the time condition. The memory sub-system then receives the second data set and continues to perform write operations to write the second data set using the first pattern in memory cells 320o, 320p, etc. (e.g., continuing to skip alternate cells). When the end of the word line 305f is reached (e.g., data written in cell 320z), the memory sub-system can switch to perform the remaining write operations using the second pattern as described in FIG. 2B. In doing so, the elapsed time between write operations on adjacent cells 320a and 330a satisfies the time condition.

In another example, instead of continuing to perform the write operations for the second data set using the first pattern and writing in cell 320o, upon determining that the elapsed time satisfies the time condition, the memory sub-system can switch to the second pattern (e.g., inverse pattern) and write the second set of data starting in cell 330a, and continue to write in cell 330b, 330c, etc., as depicted in FIG. 3B. In doing so, the elapsed time between write operations on adjacent cells 320a and 330a satisfies the time condition.

In one implementation, it is determined that an elapsed time between performing a first write operation for the first data set and a first write operation for the second data set does not satisfy the time condition (e.g., elapsed time is equal to or less than the threshold time). For example, the first data set received at a time t1 can include a small amount of data that can be fully written in memory cell 320a at time t2. The second data set can be received at time t3, where elapsed time between time t2 and time t3 is less than the threshold time. As such, the memory sub-system continues to perform the write operations for the second data set using the first pattern in memory cells 320b, 320c, and so on, such that write operations for the second data set are not performed on adjacent data cells. Once it is determined that the elapsed time since the write operation on cell 320a satisfies the threshold time, the memory sub-system can continue to write the remaining data using the first pattern in memory cell 320o, 320p etc. Alternatively the memory sub-system can switch to the second pattern after the elapsed time satisfies the time condition, writing the remaining of the second data set to memory cells 330a, 330b, 330c, and so on. In doing so, the elapsed time between write operations on adjacent cells 320a and 330a satisfies the time condition.

In some implementation, different patterns other than the checkerboard and inverse checkerboard patterns are used to perform the write operations. For example, instead of skipping one memory cell that is adjacent to the aggressor cell, the memory sub-system can skip two, or more, memory cells after writing the data in the aggressor cell, and continue the pattern. Various other patterns can be used which can result in the memory sub-system to perform consecutive write operations in cells that are not adjacent to each other while performing write operations in adjacent cells with an elapsed time that meets a time condition. Even though concepts in FIGS. 2A-2B and FIGS. 3A-3B has been described using particular patterns, the patterns that can be used by the memory sub-system to achieve write operations in adjacent cells with a delay is not limited to the particular patterns.

Figure 4:
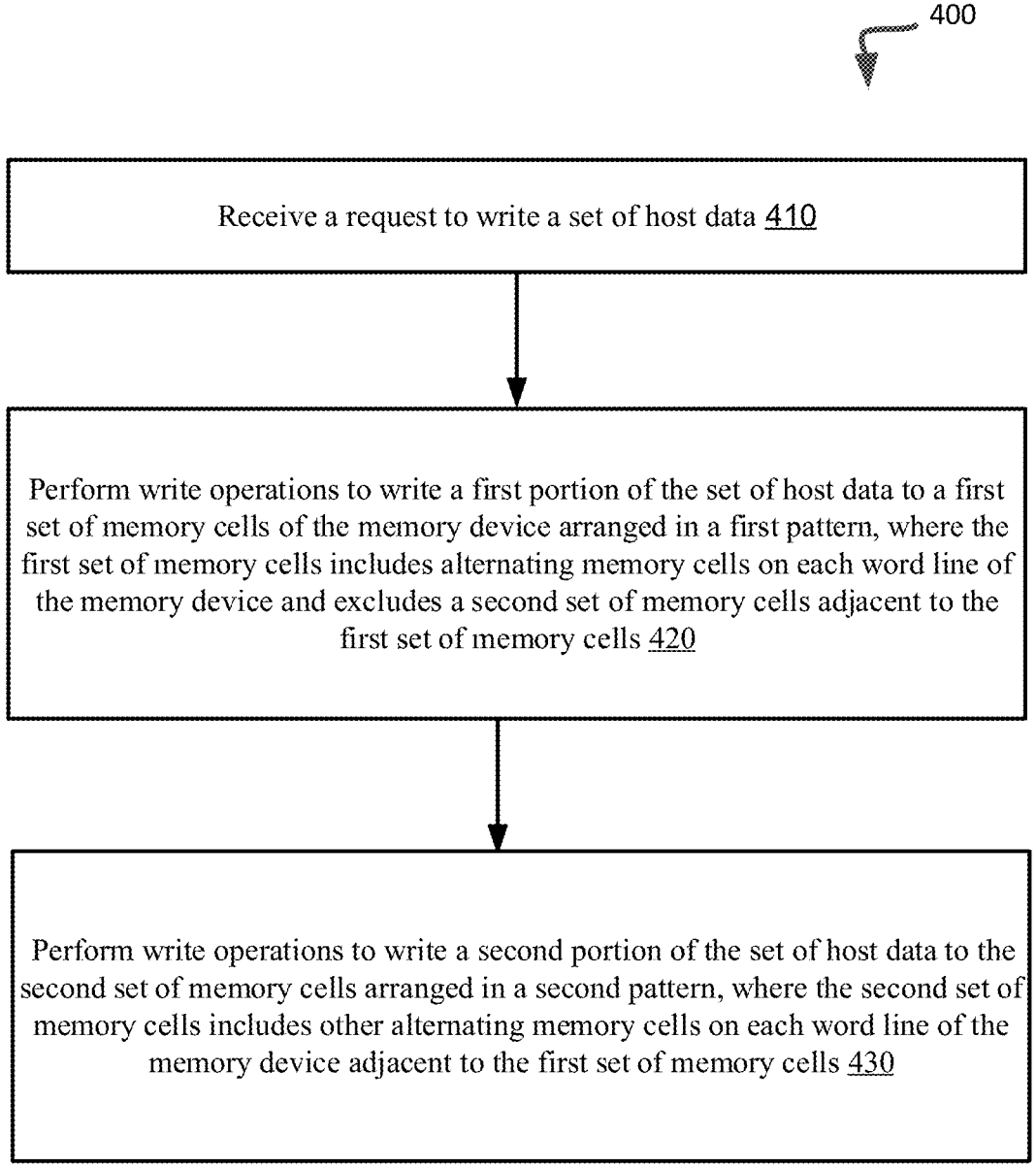
FIG. 4 is a flow diagram of an example method to perform write operations in adjacent cells with a delay, in accordance with some embodiments of the present disclosure.

FIG. 4 is a flow diagram of an example method 400 to perform write operations in adjacent cells with a delay, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the delay handling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a request to write a set of host data. In some examples, the processing logic can receive a first request to write a first set of host data and a second request to write a second set of host data. At operation 420, the processing logic performs write operations to write a first portion of the set of host data to a first set of memory cells of the memory device arranged in a first pattern. The first set of memory cells arranged in the first pattern includes alternating memory cells on each word line of the memory device and excludes a second set of memory cells adjacent to the first set of memory cells. In an example, the write operations are consecutive write operations.

At operation 430, the processing logic performs a second plurality of write operations to write a second portion of the set of host data to the second set of memory cells arranged in a second pattern. The second set of memory cells arranged in the second pattern includes other alternating memory cells on each word line of the memory device adjacent to the first set of memory cells. In an example, each of the second set of memory cells can be adjacent to each of the first set of memory cells. In some examples, performing the first plurality of write operations to the first set of memory cells arranged in the first pattern and performing the second plurality of write operations to the second set of memory cells arranged in the second pattern causes an elapsed time between writing to adjacent cells of the memory device to satisfy a time condition. In an example, the elapsed time satisfies the time condition when the elapsed time is greater than a threshold time. In an example, the processing logic, by performing the second plurality of write operations to the second set of memory cells arranged in the second pattern, causes one of the alternating memory cells in the first set of memory cells arranged in the first pattern to be adjacent to a corresponding one of the other alternating memory cells in the second set of memory cells arranged in the second pattern. In some examples, the first pattern and the second pattern are predefined patterns that identify available memory cells for performing the first plurality of write operations and the second plurality of write operations, respectively.

Figure 5:
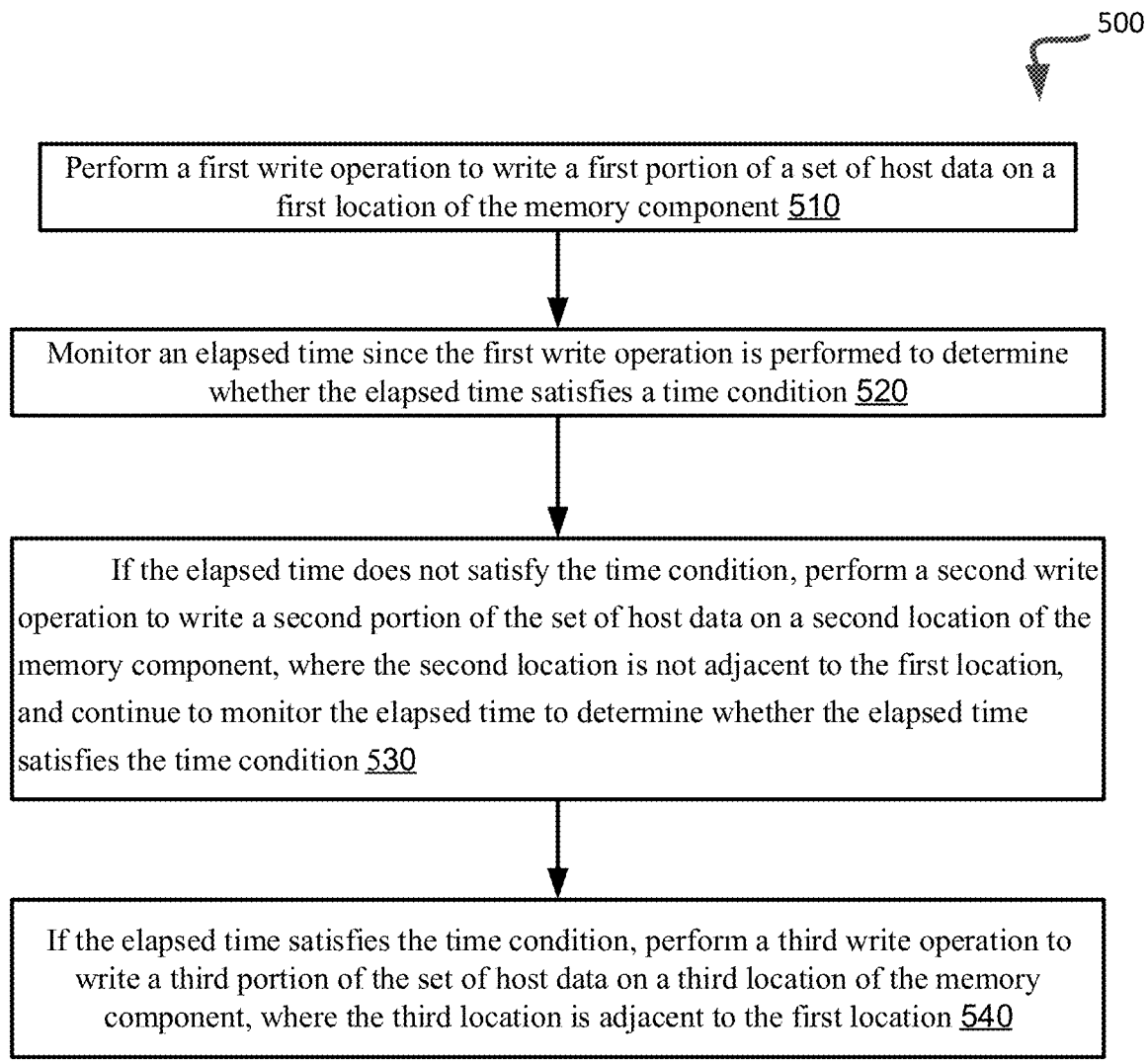
FIG. 5 is a flow diagram of performing write operations using a time condition, in accordance with some embodiments of the present disclosure.

FIG. 5 is a flow diagram of an example method 500 for performing write operations using a time condition, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the delay handling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic performs a first write operation to write a first portion of a set of host data on a first location of the memory device. In an example, the first location corresponds to a first memory cell of the memory device. The memory cell can be located at the intersection of a word line and a bit line.

At operation 520, the processing logic monitors an elapsed time since the first write operation is performed to determine whether the elapsed time satisfies a time condition. In an example, the elapsed time satisfies the time condition when the elapsed time is greater than a threshold time, and the elapsed time does not satisfy the time condition when the elapsed time is equal to or less than the threshold time.

At operation 530, the processing logic, responsive to determining that the elapsed time does not satisfy the time condition, performs a second write operation to write a second portion of the set of host data on a second location of the memory device, wherein the second location is not adjacent to the first location. In an example, the first write operation and the second write operation are performed according to a first pattern that causes the first location to be not adjacent to the second location. In some examples, the first pattern is a predefined pattern that identifies available locations for performing write operations. Additionally, the processing logic continues to monitor the elapsed time to determine whether the elapsed time satisfies the time condition.

At operation 540, the processing logic, responsive to determining that the elapsed time satisfies the time condition, performs a third write operation to write a third portion of the set of host data on a third location of the memory device, wherein the third location is adjacent to the first location. Additionally, subsequent to performing the third write operation, the processing logic performs a fourth write operation to write a fourth portion of the set of host data on a fourth location of the memory device, where the fourth location is adjacent to the second location. In an example, the second write operation and the fourth write operation are performed according to a second pattern that causes the third location to be adjacent to the first location and the fourth location to be adjacent to the second location.

Furthermore, responsive to determining that the elapsed time satisfies the time condition and prior to performing the third write operation, the processing logic performs a fifth write operation to write a fifth portion of the set of host data on a fifth location of the memory device, wherein the fifth location is not adjacent to the first location or the second location.

Figure 6:
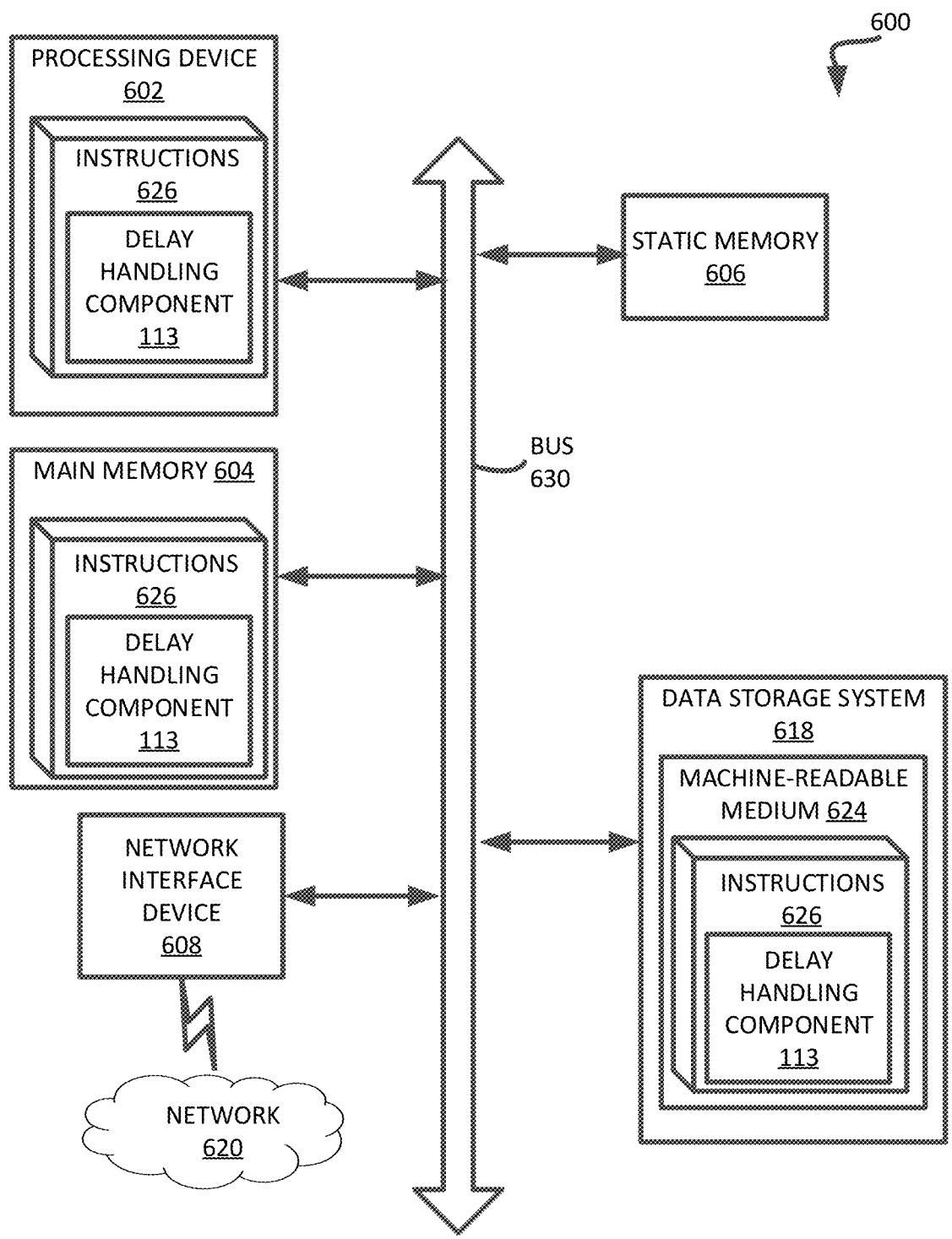
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the delay handling component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a delay handling component (e.g., the delay handling component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
  performing a first write operation to write a first portion of a set of host data to a first location of the memory device;
  determining whether a first elapsed time since the first write operation is performed does not satisfy a time condition; and
  responsive to determining that the elapsed time does not satisfy the time condition, performing a second write operation to write a second portion of the set of host data to a second location of the memory device not adjacent to the first location.

2. The system of claim 1, wherein the first elapsed time does not satisfy the time condition when the first elapsed time is equal to or less than a threshold time.

3. The system of claim 1, wherein the first write operation and the second write operation are performed according to a first pattern that causes the first location to be not adjacent to the second location.

4. The system of claim 1, wherein the first pattern is a predefined pattern that identifies available locations for performing write operations.

5. The system of claim 1, wherein the operations further comprise:
  determining that a second elapsed time since the first operation is performed satisfies the time condition, wherein the second elapsed time satisfies the time condition when the second elapsed time is greater than a threshold time; and
  responsive to determining that the second elapsed time satisfies the time condition, performing a third write operation to write a third portion of the set of host data to a third location of the memory device adjacent to the first location.

6. The system of claim 5, wherein the operations further comprise:
  subsequent to performing the third write operation, performing a fourth write operation to write a fourth portion of the set of host data on a fourth location of the memory device adjacent to the second location.

7. The system of claim 6, wherein the second write operation and the fourth write operation are performed according to a second pattern that causes the third location to be adjacent to the first location and the fourth location to be adjacent to the second location.

8. The system of claim 5, wherein the operations further comprise:
responsive to determining that the second elapsed time satisfies the time condition and prior to performing the third write operation, performing, by the processing device, a fourth write operation to write a fourth portion of the set of host data on a fourth location of the memory device not adjacent to the first location or the second location.

9. A method comprising:
performing, by a processing device, a first write operation to write a first portion of a set of host data to a first location of a memory device;
determining, by the processing device, that a first elapsed time since the first write operation is performed does not satisfy a time condition; and
responsive to determining that the first elapsed time does not satisfy the time condition, performing, by the processing device, a second write operation to write a second portion of the set of host data to a second location of the memory device not adjacent to the first location.

10. The method of claim 9, wherein the first elapsed time does not satisfy the time condition when the first elapsed time is equal to or less than a threshold time.

11. The method of claim 9, wherein the first write operation and the second write operation are performed according to a first pattern that causes the first location to be not adjacent to the second location, and wherein the first pattern is a predefined pattern that identifies available locations for performing write operations.

12. The method of claim 9, further comprising:
determining, by the processing device, that a second elapsed time since the first operation is performed satisfies the time condition, wherein the second elapsed time satisfies the time condition when the second elapsed time is greater than a threshold time; and
responsive to determining that the second elapsed time satisfies the time condition, performing, by the processing device, a third write operation to write a third portion of the set of host data to a third location of the memory device adjacent to the first location.

13. The method of claim 12, further comprising:
subsequent to performing the third write operation, performing, by the processing device, a fourth write operation to write a fourth portion of the set of host data on a fourth location of the memory device adjacent to the second location.

14. The method of claim 13, wherein the second write operation and the fourth write operation are performed according to a second pattern that causes the third location to be adjacent to the first location and the fourth location to be adjacent to the second location.

15. The method of claim 9, further comprising:
responsive to determining that the second elapsed time satisfies the time condition and prior to performing the third write operation, performing, by the processing device, a fourth write operation to write a fourth portion of the set of host data on a fourth location of the memory device not adjacent to the first location or the second location.

16. A non-transitory computer-readable storage medium comprising instructions that, when executed by a processing device, cause the processing device to:
perform a first write operation to write a first portion of a set of host data to a first location of a memory device;
determine whether an elapsed time since the first write operation is performed satisfies a time condition; and
responsive to determining that the elapsed time satisfies the time condition, perform a second write operation to write a second portion of the set of host data on a second location of the memory device adjacent to the first location.

17. The non-transitory computer-readable storage medium of claim 16, wherein the elapsed time satisfies the time condition when the elapsed time is greater than a threshold time.

18. The non-transitory computer-readable storage medium of claim 16, wherein the processing device is further to:
subsequent to performing the second write operation, perform a third write operation to write a third portion of the set of host data on a third location of the memory device adjacent to the second location.

19. The non-transitory computer-readable storage medium of claim 18, wherein the first write operation and the third write operation are performed according to a pattern that causes the third location to be adjacent to the first location.

20. The non-transitory computer-readable storage medium of claim 16, wherein the processing device is further to:
responsive to determining that the elapsed time satisfies the time condition and prior to performing the second write operation, performing a third write operation to write a third portion of the set of host data on a third location of the memory device, wherein the third location is not adjacent to the first location or the second location.

* * * * *